(12) United States Patent
Nagel et al.

(10) Patent No.: US 10,678,109 B2
(45) Date of Patent: Jun. 9, 2020

(54) DISTRIBUTED DEVICE NETWORK-BASED CONTROL SYSTEM WITH DECOUPLED INTELLIGENCE FOR SMART WINDOWS

(71) Applicant: KINESTRAL TECHNOLOGIES, INC., South San Francisco, CA (US)

(72) Inventors: Paul Nagel, South San Francisco, CA (US); Wally Barnum, South San Francisco, CA (US); Stephen Coffin, South San Francisco, CA (US); Jonathan Ziebarth, South San Francisco, CA (US)

(73) Assignee: KINESTRAL TECHNOLOGIES, INC., Hayward, CA (US)

( * ) Notice: Subject to any disclaimer, the term of this patent is extended or adjusted under 35 U.S.C. 154(b) by 301 days.

(21) Appl. No.: 15/265,760

(22) Filed: Sep. 14, 2016

(65) Prior Publication Data

US 2017/0003567 A1 Jan. 5, 2017

Related U.S. Application Data

(62) Division of application No. 14/821,371, filed on Aug. 7, 2015, now Pat. No. 9,470,947.

(Continued)

(51) Int. Cl.
*G02F 1/153* (2006.01)
*G02F 1/163* (2006.01)
(Continued)

(52) U.S. Cl.
CPC .............. *G02F 1/163* (2013.01); *B60R 1/088* (2013.01); *E06B 9/24* (2013.01); *G01R 19/003* (2013.01);
(Continued)

(58) Field of Classification Search
CPC . E06B 3/6722; E06B 7/28; E06B 9/24; E06B 9/40; E06B 9/68; E06B 2009/2464;
(Continued)

(56) References Cited

U.S. PATENT DOCUMENTS

2015/0116811 A1* 4/2015 Shrivastava ........... G08C 17/02
359/275
2016/0154290 A1* 6/2016 Brown ................ H04L 12/4625
359/275
2018/0088432 A1* 3/2018 Shrivastava ............ G02F 1/163

* cited by examiner

*Primary Examiner* — Mahidere S Sahle
(74) *Attorney, Agent, or Firm* — Womble Bond Dickinson (US) LLP

(57) ABSTRACT

A distributed device control system is provided. The system includes a plurality of windows, each window of the plurality of windows having at least one electrochromic window, a voltage or current driver for the at least one electrochromic window, and a first control system local to the window. The system includes a plurality of window controllers, each window controller configured to couple to one or more of the plurality of windows and having a second control system, for the one or more of the plurality of windows, local to the window controller. The system includes a command and communication device configured to couple to each of the plurality of window controllers, configured to couple to a network, and having a third control system, for the plurality of windows, wherein control of the plurality of windows is distributed across the plurality of windows, the plurality of window controllers, the command and communication device, and a portion of the network.

12 Claims, 5 Drawing Sheets

Related U.S. Application Data

(60) Provisional application No. 62/102,504, filed on Jan. 12, 2015.

(51) Int. Cl.

| | | |
|---|---|---|
| *G02F 1/01* | (2006.01) | |
| *G09G 3/16* | (2006.01) | |
| *G09G 3/19* | (2006.01) | |
| *B60R 1/08* | (2006.01) | |
| *E06B 9/24* | (2006.01) | |
| *G05B 19/042* | (2006.01) | |
| *G01R 19/00* | (2006.01) | |
| *G02F 1/155* | (2006.01) | |
| *H04L 29/08* | (2006.01) | |

(52) U.S. Cl.
CPC ....... *G02F 1/0123* (2013.01); *G05B 19/0428* (2013.01); *G09G 3/16* (2013.01); *G09G 3/19* (2013.01); *E06B 2009/2464* (2013.01); *G02F 1/0121* (2013.01); *G02F 1/155* (2013.01); *G02F 2001/1635* (2013.01); *G05B 2219/23104* (2013.01); *G05B 2219/2628* (2013.01); *H04L 67/12* (2013.01)

(58) Field of Classification Search
CPC ..... E06B 2009/6818; E06B 2009/6827; G02F 1/163; G02F 1/0018; G02F 1/15; G02F 1/13306; G02F 1/13318; G02F 2203/01; G05B 11/01; G05B 13/024; G05B 2219/2642; G05B 2219/2628; G05B 2219/2653; Y02A 30/257; Y02B 20/46; Y02B 20/40; Y02B 80/50
USPC ..... 160/5; 250/203.4, 208.1, 208.2, 214 AL; 315/149; 359/245, 275; 362/1, 276
See application file for complete search history.

DISTRIBUTED DEVICE NETWORK-BASED CONTROL SYSTEM WITH DECOUPLED INTELLIGENCE FOR SMART WINDOWS

BACKGROUND

Electrochromic devices, in which optical transmissivity is electrically controlled, are in current usage in building windows and in dimmable automotive rearview mirrors. Generally, electrochromic windows for a building are controlled with a driver and a user input, e.g., a dimmer control. Electrochromic rearview mirrors in automotive usage often have a light sensor aimed to detect light from headlights of automobiles, and are user-settable to engage an auto-dim function that adjusts the tint of the mirror based on input from the light sensor. There is a need in the art for a control system for electrochromic devices which goes beyond such basic settings and functions.

SUMMARY

In some embodiments, a distributed device control system is provided. The system includes a plurality of windows, each window of the plurality of windows having at least one electrochromic window, a voltage or current driver for the at least one electrochromic window, and a first control system local to the window. The system includes a plurality of window controllers, each window controller configured to couple to one or more of the plurality of windows and having a second control system, for the one or more of the plurality of windows, local to the window controller. The system includes a command and communication device configured to couple to each of the plurality of window controllers, configured to couple to a network, and having a third control system, for the plurality of windows, wherein control of the plurality of windows is distributed across the plurality of windows, the plurality of window controllers, the command and communication device, and a portion of the network.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A smart window system, disclosed herein, has a distributed device network control system architecture that can distribute control of optical transmissivity of smart windows across the smart windows, intelligent window controllers, a command and communication device, and one or more resources on a network. A smart window within such a system can be defined as a window with some local and/or external or remote computer processing capabilities and which is connectable to the internet. In some embodiments the window is an electrochromic window but this is not meant to be limiting as non-electrochromic windows may be smart windows as described herein. Electrochromic and non-electrochromic windows may be integrated into the same system in some embodiments. The smart window may function as a glass partition in some embodiments and be within an interior of a structure rather than have one surface facing an exterior in some embodiments. The smart window system combines input from sensors integrated with the smart windows, user input, and information and direction from the network to control the smart windows in an interactive, adaptive manner Control can shift from one component to another, be shared across multiple components, or be overridden by one component of the system, in various embodiments. The distributed nature of the architecture and the control support various system behaviors and capabilities.

Figure 1:
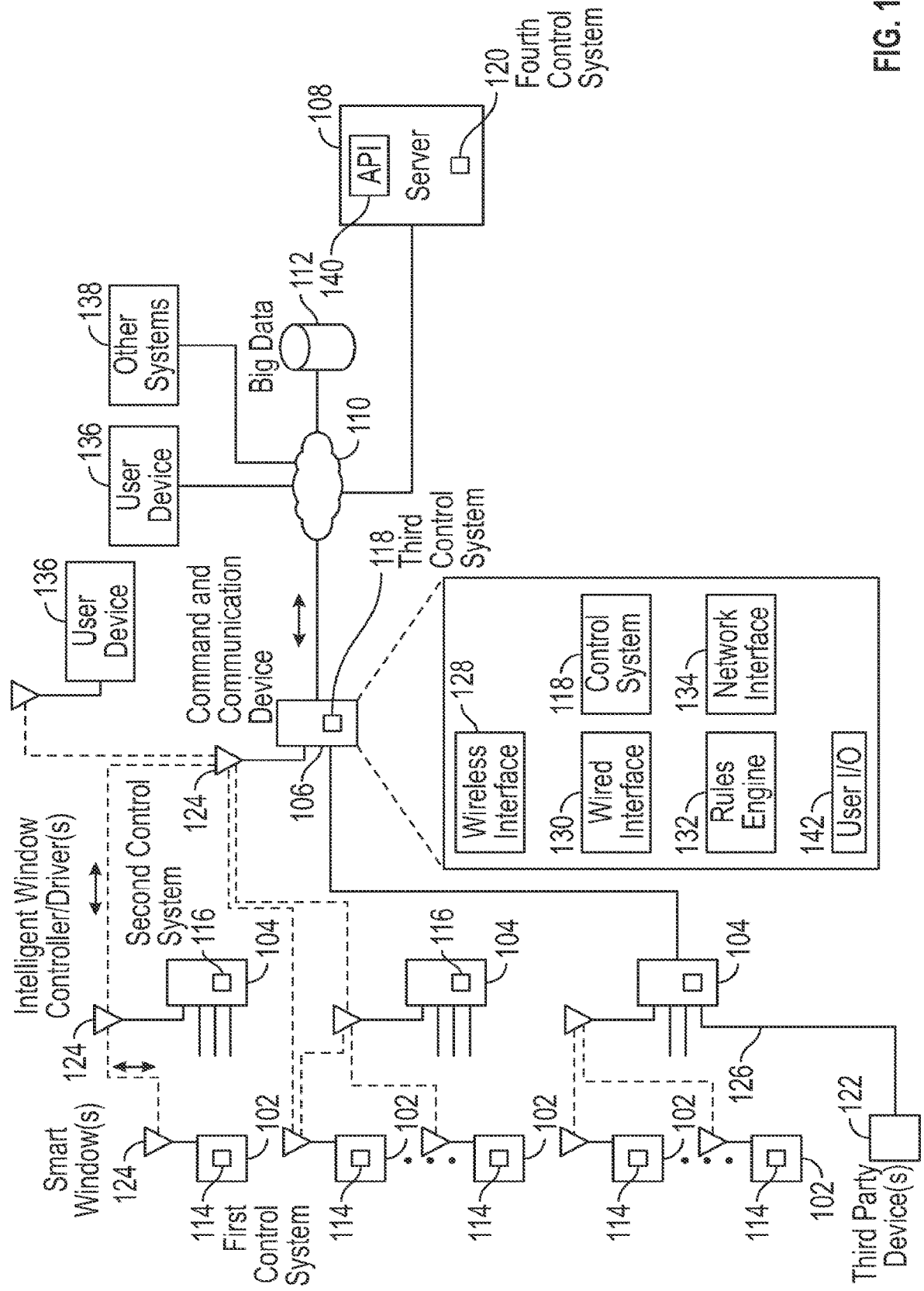
FIG. 1 is a system diagram of a smart window system that has a distributed device network control system architecture in accordance with some embodiments.

FIG. 1 is a system diagram of a smart window system that has a distributed device network control system architecture in accordance with an embodiment of the present disclosure. The system is both modular and distributed, and is suitable for installation in various living, working or commercial spaces, such as an apartment, house, an office, a building, a store, a mall, etc. Modularity allows for replacement of individual components, upgrades, expansion, linking of two or more systems, and communication in the system and among multiple systems. Wireless couplings, wired couplings, and combinations thereof are supported by the smart window system. Although antennas 124 are shown for the wireless coupling, further embodiments could use infrared coupling.

Control is distributed across one or more first control systems 114, with one in each smart window 102, one or more second control systems 116, with one in each intelligent window controller 104 and/or in one or more user devices 136 in some embodiments, a third control system 118 in a command and communication device 106, and a fourth control system 120 in a server 108 coupled to a network 110. Each smart window 102 has an antenna 124 and is thereby wirelessly connected to a nearby intelligent window controller 104, also with an antenna 124. In further embodiments, a wired connection could be used. Each intelligent window controller 104 is wirelessly connected to the command and communication device 106, which has an antenna 124. In further embodiments, a wired connection could be used. The command and communication device 106 is coupled to a network 110, such as the global communication network known as the Internet. This coupling could be made via a wireless router (e.g., in a home, office, business or building), or a wired network connection. User devices 136 (e.g., smart phones, computers, various computing and/or communication devices) can couple to the command and communication device 106, for example by a direct wireless connection or via the network 110, or can couple to the server 108 via the network 110, as can other systems 138 and big data 112. In some embodiments, the server 108 hosts an application programming interface 140. The server 108 could be implemented in or include, e.g., one or more physical servers, or one or more virtual servers implemented with physical computing resources, or combinations thereof.

Modularity of the system supports numerous variations, layouts and installations. For example, each windowed room in a building could have one or more smart windows 102 and a single intelligent window controller 104 for that room. An intelligent window controller 104 could control smart windows 102 in part of a room, an entire room, or multiple rooms. The intelligent window controller(s) 104 for that floor of the building, or for a portion of or the entire building in some embodiments, could tie into a single command and communication device 106, which is coupled to the network 110 and thereby coupled to the server 108. In a relatively small installation, one or more smart windows 102 could couple to a single intelligent window controller 104 for local distributed control, or a single command and communication device 106 for both local and network distributed control. In another embodiment, an intelligent window controller 104 could be combined with the command and communication device 106, in a further embodiment for small systems that use both local control and network information. Larger systems, e.g., for multiple occupant buildings, could have multiple command and communication devices 106, e.g., one for each occupant or set of occupants, or each floor or level in the building, etc. Upgrades or expansions are readily accommodated by the addition of further components according to the situation. Some embodiments have a driver integrated in each smart window 102, for instance in combination with the first control system 114. Or, a driver for one or more smart windows 102 could be integrated with the intelligent window controller 104, for a lower cost or "thin" smart window 102. Such an embodiment of the intelligent window controller 104 could still be termed that, or could be termed an intelligent window controller/driver. One or more intelligent window controllers 104 could be wall-mounted, as could the command and communication device 106. Or, the system could use one or more user devices 136, each with a second control system 116, in place of one or more intelligent window controllers 104. Some embodiments use one or more intelligent window controllers 104, each with a second control system 116, and one or more user devices 136, each with a second control system 116. In a further embodiment, a user device 136 could have the third control system 118, and a wireless coupling to the network 110. It should be appreciated that in each of these variations and embodiments, communication among the various devices and subsystems can occur through wireless or wired connections and along paths that are implementation specific. Versions with one or more user devices 136 can be implemented with one or more apps (applications) executing in each user device 136.

In one embodiment as shown in FIG. 1, the command and communication device 106 has a wireless interface 128, a wired interface 130, a control system 118, a rules engine 132, a network interface 134, and a user I/O (input/output) module 142. The wireless interface 128 and/or the wired interface 130 are used for coupling to the intelligent window controller(s) 104. The network interface 134 is used for connecting to the network 110. For example, the network interface 134 could connect to a wireless router or Wi-Fi, e.g., via the wireless interface 128, or to a wired network via the wired interface 130. In some embodiments, the wireless interface 128 and/or the wired interface 130 can couple to third-party devices for sensing, input and/or output (see, e.g., description regarding FIG. 3). The rules engine 132 uses information from the network 110, which can include direction from the fourth control system 120 in the server 108, and can include information from user devices 136, other systems 138, or big data 112, to create, populate, modify, or adapt various rules for operation of the smart windows 102. The rules can include various instructions for operation of smart windows with or without network connectivity. In addition, the rules of the rules engine are adaptive in some embodiments. For example, the rules may change based on patterns of user behavior. The user I/O module 142 accepts user input, e.g., via buttons, a touchscreen, etc., and displays user output, e.g., via a display screen or with LEDs or other lamps, etc. Some embodiments may lack the user I/O module 142, or have a user input module or an output module. In keeping with the nature of this distributed control system, the third control system 118 of the command and communication device 106 can direct operation of the smart windows 102, the second control system 116 of the intelligent window controller(s) 104 can direct operation of the smart windows 102, the fourth control system 120 of the server 108 can direct operation of the smart windows 102, and/or the first control system 114 of each smart window 102 can direct operation of that smart window 102, in various combinations. Some embodiments have a failover mechanism, in which control and/or communication are routed around a failed device in the system.

As shown by the dashed lines, communication can proceed amongst various members of the smart window system over various paths, in various embodiments. In some embodiments, a message or other communication is passed along a chain, such as from a smart window 102, to an intelligent window controller 104, or via the intelligent window controller 104 to the command and communication device 106, and vice versa. In some embodiments, a device can be bypassed, either by direct communication between two devices or by a device acting as a relay. For example, a smart window 102 could communicate directly with a command and communication device 124 wirelessly via the wireless interface 128 or via the wired interface 130. Alternatively, an intelligent window controller 104 could relay a message or other communication, as could the command and communication device 106. In some embodiments, messages or communications can be addressed to any component or device in the system, or broadcast to multiple devices, etc. This could be accomplished using packets for communication, and in some embodiments any of the control systems 114, 116, 118, 120 can communicate with the cloud, e.g., the network 110. In some embodiments, smart windows 102 can act as peer devices and communicate with each other, for example to carry out a user command, communicate an event or status, or execute in accordance to one or more rules.

In one embodiment, the server 108 populates a database with information obtained from various buildings that have smart windows 102. This could include, for example, user behavior, control requests, data from smart phones or other external-to-the-house data such as weather information, detection of proximity of a user to a home, etc. The database could be accessed as cloud storage or as fixed remote storage. The server 108 is coupled to multiple houses and/or office buildings via the network 110 (e.g., the Internet), and could be coupled to other buildings such as factories, museums, schools, apartment complexes, stores, shopping malls, etc. Each of these buildings has one or more of the controllers operating the smart windows 102, and each controller communicates information to the server 108 about user preferences, settings, and operation of the smart windows 102. From this information, the server 108 determines which information to store in a database, and can provide sample user profiles, individual, group or commercial usage information, energy efficiency or other recommendations, and/or store individual or group settings, preferences and profiles. For example, actual or sample profiles or modes could be developed for commercial establishments such as restaurants, cafés, sports bars, retail space, office complexes, etc., and for users in various categories. Modes can include cooling mode, lighting mode, security mode, etc. Monthly or yearly comparisons could be generated from the database, for individual users or owners of houses, office buildings, or other personal or commercial establishments.

Figure 2:
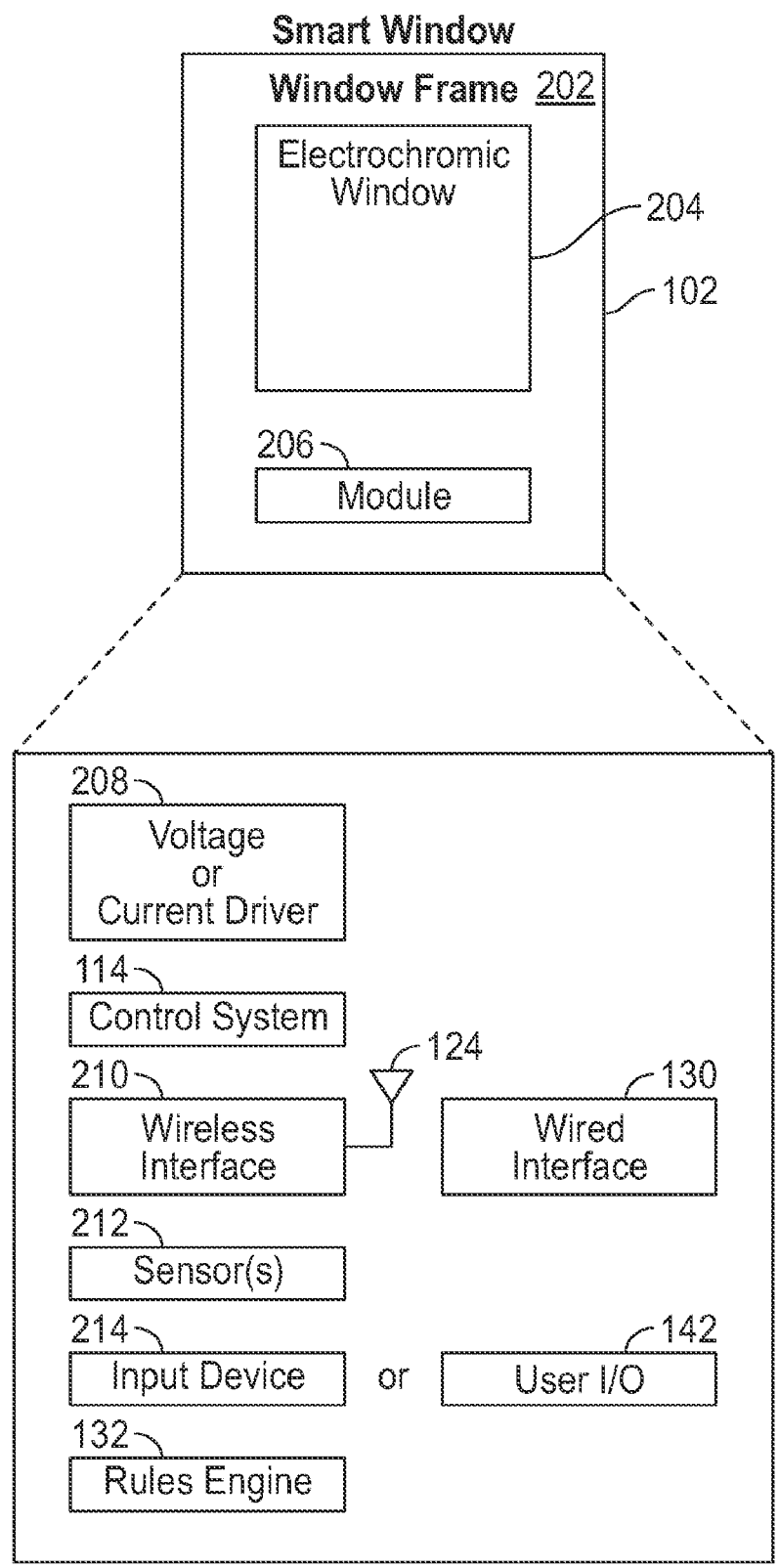
FIG. 2 is a system diagram of a smart window that has an electrochromic window and a window frame with an embedded module in accordance with some embodiments.

FIG. 2 is a system diagram of a smart window 102 that has an electrochromic window 204 and a window frame 202 with an embedded module 206. The embedded module 206 could be positioned at the bottom, top, to one or both sides, or distributed around the window frame 202 in various embodiments. The embedded module 202 has one or more sensors 212, which could include temperature, light, audio/acoustic (i.e., sound), vibration, video or still image, motion, smoke detection, chemical, humidity or other sensors, and which could be facing inwards, i.e., into a room, or outwards, i.e., to the exterior of the room or building, in various embodiments. The wireless interface 128 has an antenna 124, which is used for coupling to the intelligent window controller(s) 104, the command and communication device 106, and/or one or more user devices 136 (e.g., a smart phone, a user wearable device, etc.). A wired interface 130 could also be included, or could be used in place of a wireless interface 128. The control system 114, shown as the first control system 114 in FIG. 1, provides local control for the electrochromic window 204 via the voltage or current driver 208. Alternatively, the control system 114 participates in distributed control. Some embodiments have a rules engine 132 in the module 206. The voltage or current driver 208 sends voltage or current to bus bars of the electrochromic window 204, as directed by one or more of the control systems 114, 116, 118, 120, to control transmissivity of the electrochromic window 204. In some embodiments, to change transmissivity of the electrochromic window 204, the voltage or current driver 208 provides constant current until a sense voltage of the electrochromic window 204 is reached. Then, the voltage or current driver 208 provides a current that maintains the sense voltage at a constant voltage, until a total amount of charge is transferred to the electrochromic window 204 for the new transmissivity level. The embedded module 206 also includes an input device 214, or a user I/O module 142, through which user input can be entered at the smart window 102. In some embodiments, user input can also be entered through the wireless interface 128, e.g., from a smart phone.

Figure 3:
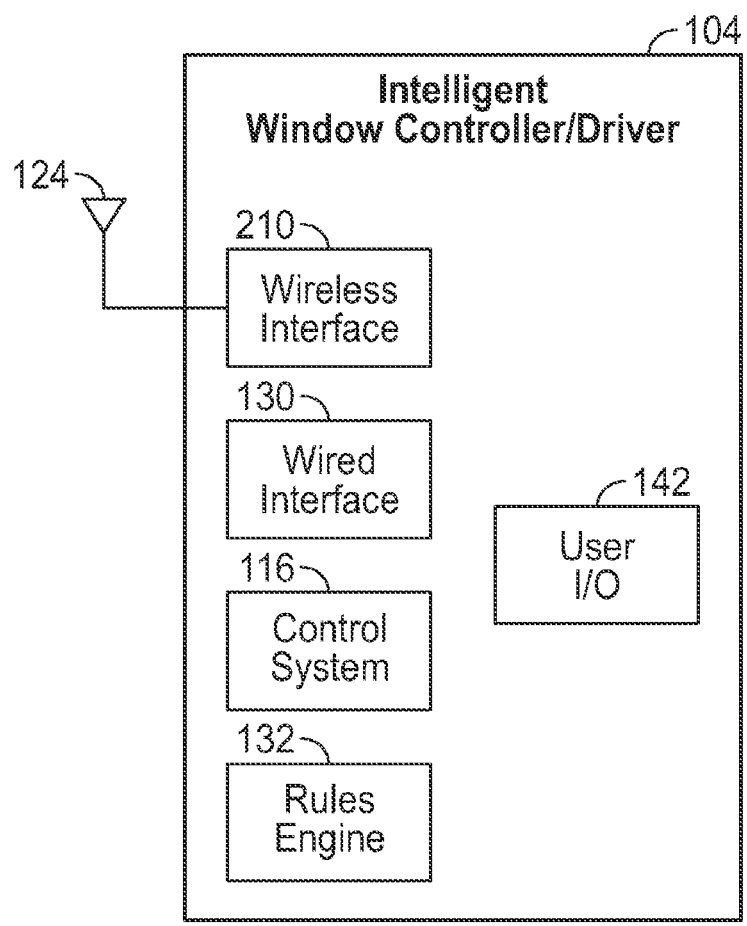
FIG. 3 is a system diagram of an intelligent window controller, from the smart window system of FIG. 1 in accordance with some embodiments.

FIG. 3 is a system diagram of an intelligent window controller 104, from the smart window system of FIG. 1. The intelligent window controller 104 includes a wireless interface 128 with an antenna 124, a wired interface 130, a user I/O module 142, and a control system 116, which is shown as the second control system 116 in FIG. 1. Some embodiments have a rules engine 132. The wireless interface 128 couples to one or more smart windows 102 via the wireless interface 128, as shown in FIG. 1, although the wired interface 130 could be used in further embodiments. Either the wireless interface 128 or the wired interface 130 can be used to couple to the command and communication device 106, in various embodiments. Some embodiments have both the wireless interface 128 and the wired interface 130, and each of these can communicate to other components and devices as a failover if the other fails. In some embodiments, the wireless interface 128 and/or the wired interface 130 can couple to further devices, such as third-party devices for input information, sensing or control output. For example, the system could control or interact with lighting controllers, HVAC (heating, ventilation and air-conditioning, e.g., by coupling to a thermostat), burglar and/or fire alarm systems, smart phones, or other systems or devices, or receive further input from further sensors, cameras, etc. The user I/O module 142 could include buttons, a touchpad, a touchscreen, a display screen, etc., for user input to the system and/or output from the system. The second control system 116 participates in distributed control with the first control system 114 of the smart window 102, or can override the first control system 114. In some embodiments, the second control system 116 relays direction from the third control system 118 of the command and communication device, or the fourth control system 120 of the server 108, to one or more smart windows 102.

Figure 4:
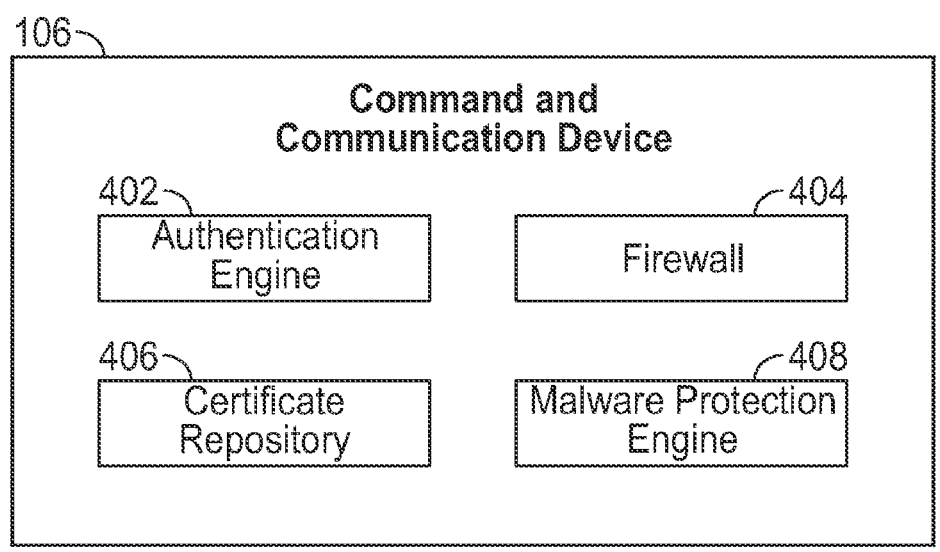
FIG. 4 is a system diagram of a command and communication device, from the smart window system of FIG. 1 in accordance with some embodiments.

FIG. 4 is a system diagram of a command and communication device 106, from the smart window system of FIG. 1. Since the command and communication device 106 is coupled to the network 110, in some embodiments the command and communication device 106 has various protections against unauthorized access. Various embodiments have one, some, or all of the following protections, and various combinations, and may have further protections in variations thereof. Here, the command and communication device 106 has a firewall 104, a malware protection engine 408, an authentication engine 402, and a certificate repository 406. The firewall 104 is applied in a conventional manner, to communications arriving via the wired interface 130 or the wireless interface 128 (see FIG. 1).

The authentication engine 402 can be applied to authenticate any component that is coupled to or desires to couple to the command and communication device 106. For example, each smart window 102 could be authenticated, each intelligent window controller 104 could be authenticated, and the server 108 could be authenticated, as could any user device 136 or other system 138 attempting to access the smart window system. The command and communication device 106 can authenticate itself, for example to the server 108. To do so, the command and communication device 106 uses a certificate from the certificate repository 406 for an authentication process (e.g., a "handshake") applied by the authentication engine 402. In some embodiments, certificates are created and issued by a trusted third-party certificate authority to a manufacturer of the smart windows 102, and stored in memory in each smart window 102. A certificate could be revoked or updated by actors higher in the distributed control system, for example from a management application in the network 110 (e.g., in the fourth control system 120 or elsewhere in the cloud).

The malware protection engine 408 can look for malware in any of the communications received by the commanded communication device 106, and block, delete, isolate or otherwise handle suspected malware in a manner similar to how this is done on personal computers, smart phones and the like. Updates, e.g., malware signatures, improved malware detection algorithms, etc., are transferred to the malware protection engine 408 via the network 110, e.g., from the server 108 or one of the other systems 138 such as a malware protection service.

Figure 5:
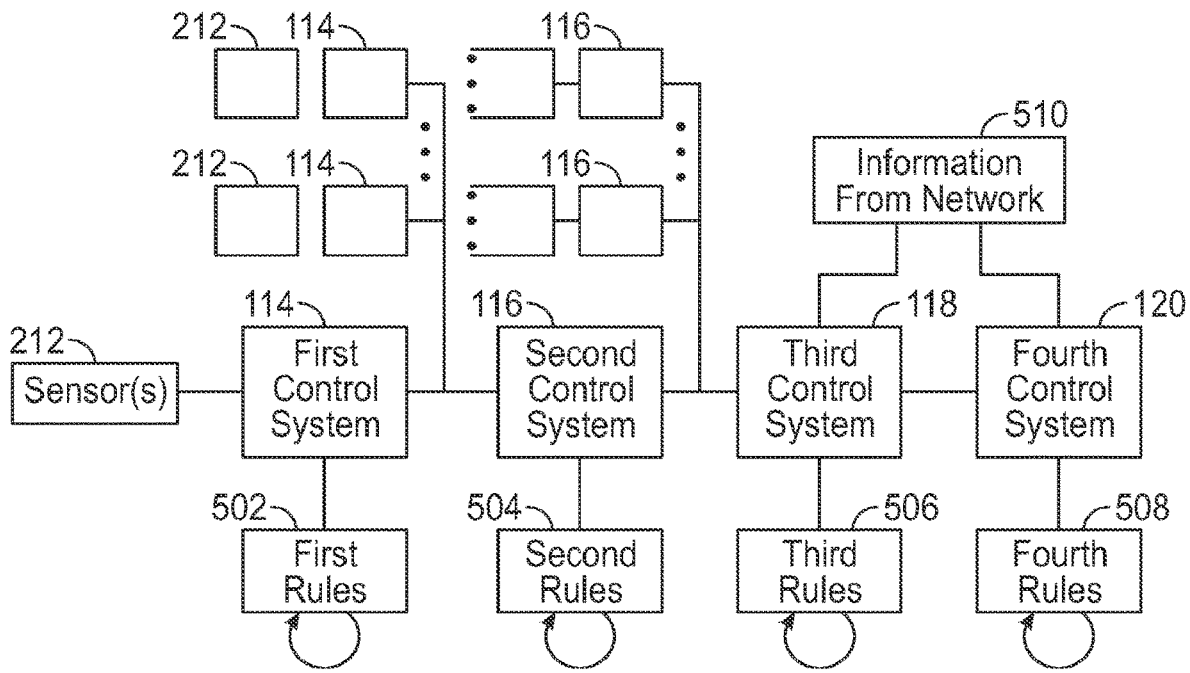
FIG. 5 is a block diagram showing aspects of the distributed device network control system architecture of FIG. 1 in accordance with some embodiments.

FIG. 5 is a block diagram showing aspects of the distributed device network control system architecture of FIG. 1. Although this architecture lends itself to hierarchical control, which is nonetheless possible and can be performed by overrides from components higher up in the chain, it should be appreciated that control is generally distributed across and movable among the first control system(s) 114, the second control system(s) 116, the third control system 118 and the fourth control system 120, i.e., distributed across and movable among the server 108, the command and communication device 106, the intelligent window controllers 104, and the smart windows 102. Some embodiments omit one or more of the control systems 114, 116, 118, 120, and some embodiments form a lumped control system. Some embodiments can function if one or more of the control systems 114, 116, 118, 120 is temporarily or permanently omitted as a result of failure or network outage, by lumping control functions together, operating in a failover mode, or otherwise compensating for the omission. A temporarily failed or omitted control system 114, 116, 118, 120 can rejoin and participate in system recovery with resumption of appropriate control functions and resolution of parameters or rules. Embodiments with two or more of the control systems 114, 116, 118, 120 have a distributed control system. Smart windows 102 can be operated individually, or in various groups (e.g., facing in a particular direction, or associated with a particular room or group of rooms, or level or floor of a house or other building, subsets or groupings of windows, and so on) using this distributed control architecture. Generally, each control system 114, 116, 118, 120 controls or directs one or more of the smart windows 102, in cooperation with other members of the system. Each control system 114, 116, 118, 120 has respective rules, e.g., the first control system 114 has first rules 502, the second control system has second rules 504, the third control system 118 has third rules 506, the fourth control system 120 has fourth rules 508. Each control system 114, 116, 118, 120 operates according to its local rules, which may incorporate rules distributed from other devices, unless overridden by another device in the system. Rules can include cooperation with other devices, and rules can include instructions allowing for when an override is permissible. For example, an intelligent window controller 104 could override a smart window 102, the command and communication device 106 could override an intelligent window controller 104 or a smart window 102, the server 108 could override the command and communication device 106, an intelligent window controller 104, or a smart window 102, or user input at one of the devices or from a user device 136 could override one or more of these. Information from the sensors 212 of the smart window(s) 102 enters the system through the first control system(s) 114, and can be routed or directed to any of the further control systems 116, 118, 120. Information 510 from the network enters the system through the fourth control system 120, i.e., the server 108, and/or the third control system 118, i.e., the command and communication device 106, and can be routed or directed to any of the further control systems 114, 116. User input can enter the system through the smart windows 102, e.g., through user input at that smart window 102 or wireless user input from a user device 136 to the smart window 102. User input can also enter the system through the intelligent window controller(s) 104, e.g., through user input at the intelligent window controller 104 or wireless user input from a user device 136. User input can enter the system through the third control system 118, e.g., through a wireless coupling from a user device 136 or via the network connection, e.g., from a user device 136. User input can enter the system through the fourth control system 120, e.g., via the server 108. From any of these entry points, the user input can be routed to any of the control systems 114, 116, 118, 120. Each of the control systems 114, 116, 118, 120 can communicate with each other control system 114, 116, 118, 120, and can update respective rules 502, 504, 506, 508 as self-directed or directed by another one or combination of the control systems 114, 116, 118, 120. Control can be cooperative, voted, directed, co-opted, overridden, local, distributed, hierarchical, advisory, absolute, and so on, in various combinations at various times during operation of the system, in various embodiments.

In some embodiments, the smart window system operates the smart windows 102 in a continuous manner, even if there is a network 110 outage (e.g., there is a network outage outside of the building, a server is down, or a wireless router for the building is turned off or fails, etc.). The first control system 114, the second control system 116 and/or the third control system 118 can direct the smart windows 102 without information from the network, under such circumstances. In various combinations, each of the control systems 114, 116, 118, 120 can create, store, share and/or distribute time-bound or event-bound instructions (e.g., instructions with goals to perform a particular action at or by a particular time or for a specified event or specified number of events), and these time-bound instructions provide continuity of operation even when one or more devices, or a network, has a failure. When the network 110 is available, the third control system 118 obtains weather information from the network, either directly at the third control system 118 or with assistance from the server 108. For example, the third control system 118 could include and apply cloud-based adaptive algorithms. With these, the third control system 118 can then direct operation of the smart windows 102 based on the weather information. One or a combination of the control systems 114, 116, 118, 120 can direct operation of the smart windows 102 based on sensor information, such as from light, image, sound or temperature sensors of the smart windows 102. For example, if the weather information indicates cloud cover, or sensors 212 are picking up lowered light levels, the system could direct an increase in transmissivity of the smart windows 102, to let more natural light in to the building. If the weather information indicates bright sun, or sensors 212 are picking up increased or high light levels, the system could direct a decrease in transmissivity of the smart windows 102, to decrease the amount of natural light let in to the building. The system can modify such direction according to orientation of each window, so that windows pointing away from the incidence of sunlight are directed differently than windows pointing towards incidence of sunlight. If weather information indicates sunlight, and temperature sensors indicate low temperatures, the system could direct increased transmissivity of the smart windows 102, in order to let in more natural light and increase heating of a building interior naturally. In some embodiments, if the temperatures sensors indicate relatively high temperatures, the system could direct decreased transmissivity of the smart windows 102, to block natural light and thereby hold down the heating of the interior of the building by sunlight.

Figure 6:
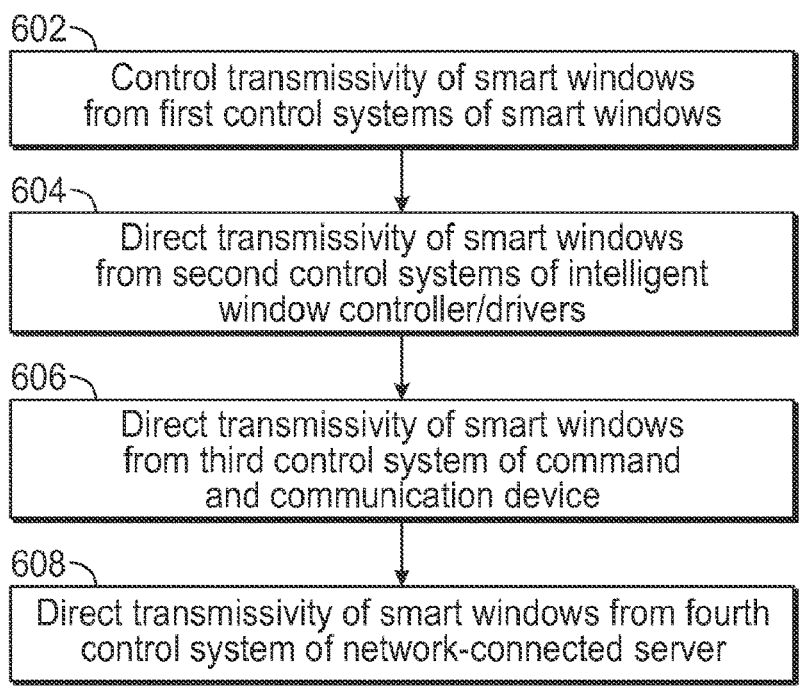
FIG. 6 is a flow diagram of a method of operating a smart window system, which can be practiced on or using the smart window system of FIG. 1 in accordance with some embodiments.

FIG. 6 is a flow diagram of a method of operating a smart window system, which can be practiced on or using the smart window system of FIG. 1 or further embodiments thereof. The method can be practiced by processors of the window system embodiments described herein. In an action 602, the transmissivity of the windows is controlled by first control systems of the windows. The control of the transmissivity may be based on sensor information from sensors of the smart windows, and direction from second control systems of intelligent window controllers coupled to the smart windows, or direction from a third control system of a command and communication device coupled to the intelligent window controllers.

In an action 604, the transmissivity of the windows is directed from the second control systems of the intelligent window controllers. The direction of the transmissivity is in cooperation with the smart windows in some embodiments. In an action 606, the transmissivity of the smart windows is directed from the third control system of the command and communication device. The direction of the transmissivity is in cooperation with the intelligent window controllers and the smart windows in some embodiments. This directing is based on the sensor information from the sensors of the smart windows, or information obtained from a network to which the command and communication device is coupled. In an action 608, the transmissivity of the smart windows is directed from a fourth control system of a network-corrected server, which is coupled to the command and communication device via the network.

Figure 7:
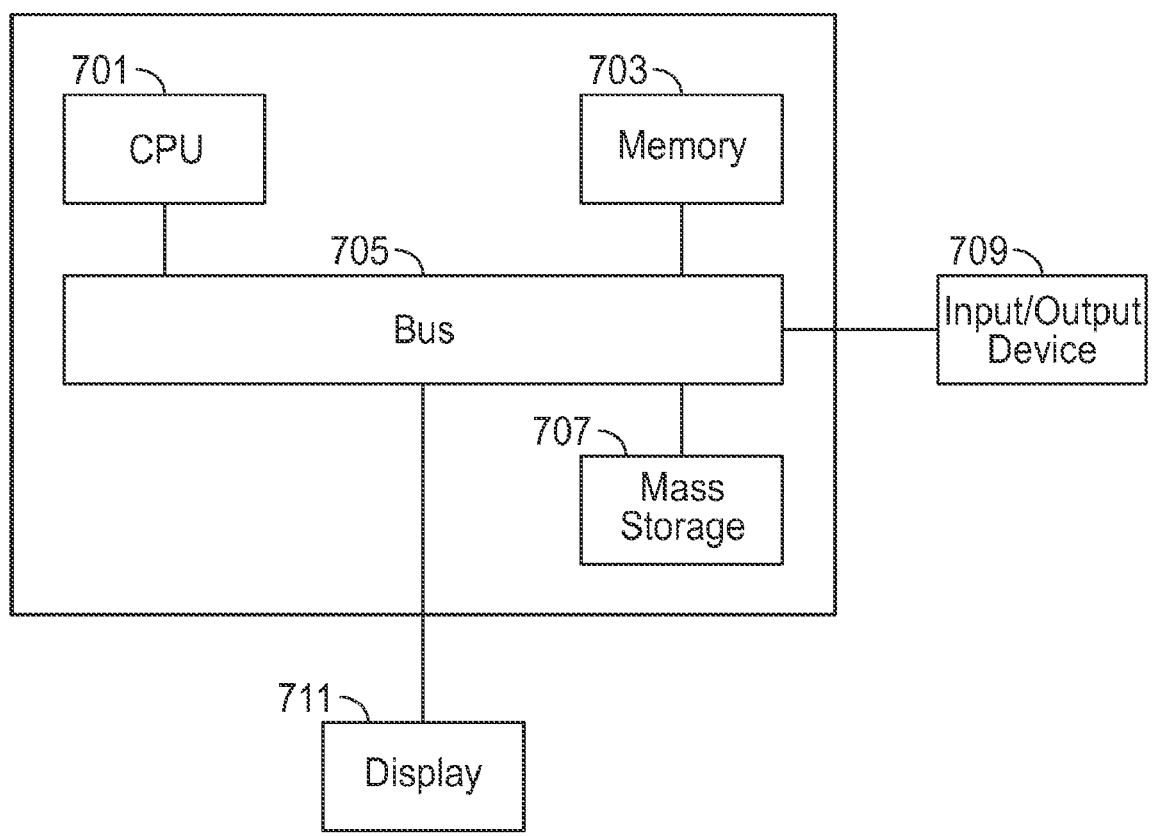
FIG. 7 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 7 is an illustration showing an exemplary computing device which may implement the embodiments described herein. The computing device of FIG. 7 may be used to perform embodiments of the functionality for controlling smart windows in accordance with some embodiments. The computing device includes a central processing unit (CPU) 701, which is coupled through a bus 705 to a memory 703, and mass storage device 707. Mass storage device 707 represents a persistent data storage device such as a floppy disc drive or a fixed disc drive, which may be local or remote in some embodiments. The mass storage device 707 could implement a backup storage, in some embodiments. Memory 703 may include read only memory, random access memory, etc. Applications resident on the computing device may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 701 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 705 in order to communicate information in command selections to CPU 701. It should be appreciated that data to and from external devices may be communicated through the input/output device 709. CPU 701 can be defined to execute the functionality described herein to enable the functionality described with reference to FIGS. 1-6. The code embodying this functionality may be stored within memory 703 or mass storage device 707 for execution by a processor such as CPU 701 in some embodiments. The operating system on the computing device may be MS DOS™, MS-WINDOWS™, OS/2™, UNIX™, LINUX™, OSX™, iOS™, Android Windows™, or other known mobile and desktop operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for controlling windows, comprising:
controlling, from first control systems of a plurality of windows, transmissivity of the plurality of windows, based on sensor information from sensors of the windows, direction from second control systems of a plurality of window controllers coupled to the plurality of windows, or direction from a third control system of a command and communication device coupled to the plurality of window controllers;
directing, from the second control systems of the plurality of window controllers, in cooperation with the plurality of windows, the transmissivity of the plurality of windows; and
directing, from the third control system of the command and communication device, in cooperation with the plurality of window controllers and the plurality of windows, the transmissivity of the plurality of windows, based on the sensor information from the sensors of the windows or information obtained from a network to which the command and communication device is coupled, wherein a server coupled to the network gathers operating information from smart windows in a plurality of buildings and develops window operating profiles or window operating modes, and wherein the control of the windows is based in part on the window operating profiles or window operating modes developed in the server.

2. The method of claim 1, wherein:
the third control system includes cloud-based adaptive algorithms; and
control and direction for the transmissivity of the plurality of windows is distributed and movable among the command and communication device, the plurality of window controllers, and the plurality of windows.

3. The method of claim 1, further comprising:
operating the plurality of windows in a continuous manner despite a network outage, via application of the first control systems, the second control systems or the third control system.

4. The method of claim 1, wherein:
the directing from the third control system is based on weather information gathered from the network; and
the sensor information includes sensor information from light, image, sound or temperature sensors of the window.

5. The method of claim 1, further comprising:
operating each window of the plurality of windows in an individual manner in accordance with the first control system of the window;
overriding the first control system of each of the plurality of windows, from the plurality of window controllers, to control the plurality of windows in accordance with the second control system of each of the plurality of window controllers; and
overriding the second control system of each of the plurality of window controllers, from the command and communication device, to control the plurality of windows in accordance with the third control system of the command and communication device.

6. The method of claim 1, further comprising:
overriding one or more of the first control systems, the second control systems and the third control system, to control the plurality of windows in accordance with a request received at the command and communication device from the network.

7. The method of claim 1, further comprising:
gathering weather information from the network and control the plurality of windows based at least in part on the weather information.

8. The method of claim 1, further comprising:
overriding, through at least one of the second control systems, the first control system of at least one of the plurality of windows to control the at least one of the plurality of windows.

9. The method of claim 1, further comprising:
overriding, through the third control system, the first control system of at least one of the plurality of windows and the second control system of at least one of the plurality of window controllers to control the at least one of the plurality of windows.

10. The method of claim 1, further comprising:
at least one of the plurality of windows and the first control system thereof configured to receive first user input at the window;
at least one of the plurality of window controllers and the second control system thereof configured to receive second user input at the window controller; and
the command and communication device and the third control system configured to receive third user input at the command and communication device and receive fourth user input from the network.

11. The method of claim 1, further comprising:
cooperating, by the first control systems, the second control systems and the third control system to control the plurality of windows based on a combination of sensor input from the windows, user input, and information from the network.

12. The method of claim 1, further comprising:
cooperating, by the first control systems, the second control systems and the third control system to control temperature of an interior of a building by controlling transmissivity of the plurality of windows.

\* \* \* \* \*